United States Patent [19]

Nakajima et al.

[11] Patent Number: 5,329,482
[45] Date of Patent: Jul. 12, 1994

[54] SEMICONDUCTOR MEMORY DEVICE AND METHOD FOR PRODUCING IT

[75] Inventors: Hideharu Nakajima; Hideaki Kuroda, both of Kanagawa, Japan

[73] Assignee: Sony Corporation, Tokyo, Japan

[21] Appl. No.: 957,147

[22] Filed: Oct. 7, 1992

[30]  Foreign Application Priority Data

Oct. 7, 1991 [JP]  Japan .................................. 3-287097

[51] Int. Cl.$^5$ ............................................ G11C 11/34
[52] U.S. Cl. .................................................... 365/182
[58] Field of Search .................. 257/344, 900; 437/41, 437/44; 365/182

[56]  References Cited

U.S. PATENT DOCUMENTS 5,091,763  2/1992  Sanchez ............................. 257/344
5,173,752  12/1992  Motonami et al. ................. 257/900

Primary Examiner—Eugene R. LaRoche
Assistant Examiner—F. Niranjan
Attorney, Agent, or Firm—Hill, Steadman & Simpson

[57]  ABSTRACT

In a semiconductor memory device, a first sidewall and a second sidewall are formed simultaneously for a memory cell section and a peripheral circuit section, and a high impurity concentration region is formed by being delimited by the second sidewall in the memory cell section, while a high impurity concentration section is formed by being delimited by the first sidewall in the peripheral circuit section. In this manner, MOS transistors having different LDD widths of the low impurity concentration regions and hence different characteristics, in which the MOS transistor of the memory cell section has improved voltage withstand properties and the MOS transistor of the peripheral circuit section has improved current driving capabilities, may be formed on the same substrate.

6 Claims, 6 Drawing Sheets

SEMICONDUCTOR MEMORY DEVICE AND METHOD FOR PRODUCING IT

BACKGROUND OF THE INVENTION

1. Field of the Invention

This invention relates to a semiconductor memory device and a method for producing the memory device. More particularly, it relates to a semiconductor memory device in which a source region and a drain region formed on a substrate of a MOS transistor consist of a high impurity region and a low impurity region, and a method for producing the semiconductor memory device.

2. Description of the Prior Art

As a construction of a MOS transistor in which electrical field concentration in the vicinity of a drain is relaxed to prevent adverse effects of hot carriers, there is known a lightly doped drain structure (LDD structure) in which a high concentration impurity region and a low concentration impurity region are combined together. For producing the LDD structure, the low concentration impurity region is formed in self-alignment with a gate electrode and a sidewall formed by an insulating film is formed on the lateral side of the gate electrode, after which a high concentration impurity region is formed in self-alignment with the sidewall.

In a semiconductor memory device, such as a dynamic RAM, a memory section consisting in a matrix array of a large number of memory cells and a peripheral circuit section for controlling data input and output to or from the memory cell section or signal timing are formed on one and the same substrate.

Meanwhile, with the above semiconductor memory device, the conventional practice has been to produce the MOS transistor of the memory cell section and that of the peripheral circuit section with different LDD structures. The reason is that, in the memory section, in which different layers are densely formed at an extremely small distance from one another, a thicker sidewall is preferred for assuring high voltage withstand characteristics between the gate electrode and other electrodes, whereas, if the sidewall film thickness is larger in the peripheral circuit, the size of the low concentration impurity region accounts for a larger proportion of the size between the source and the drain to increase resistance components or the number of hot carriers to deteriorate the current driving capability of the peripheral circuit in driving the MOS transistor.

Consequently, in some of the conventional semiconductor memory devices, the memory section has a sidewall having a larger sidewall thickness, whereas the peripheral circuit has a sidewall having a smaller sidewall thickness, such that the memory cell and peripheral circuit sections have different LDD structures.

This type of the semiconductor memory device is fabricated by a process shown in FIGS. 1 to 4.

The conventional method for producing the semiconductor memory device is explained by referring to FIGS. 1 to 4.

In a first step, shown in FIG. 1, a gate electrode 102 on the side of a memory cell section M and a gate electrode 103 on the side of a peripheral circuit section P are deposited on a silicon substrate 101 via gate oxide films. An interlayer insulating film for offsetting 104 is also deposited on the gate electrode 102 of the memory cell section M. A low concentration impurity region 105 is deposited on the substrate surface in self-alignment with the gate electrodes 102, 103. After deposition of the low concentration impurity region 105, a silicon oxide film 106, a silicon nitride film 107 and a silicon oxide film 108 are deposited step by step on the entire surface for forming a sidewall.

Then, as shown in FIG. 2, etching is carried out, using a resist layer 113, opened only at the side of the peripheral circuit P, as a mask. By this etching, the silicon oxide film 108 on the silicon nitride film 107 is etched by wet etching, and subsequently the silicon oxide film 106 is etched by reactive ion etching (RIE), as a result of which a sidewall 109 having a reduced film thickness dp corresponding to the film thickness of only the silicon oxide film 106 is formed on the sidewall of the gate electrode 103.

Then, as shown in FIG. 3, the memory cell section M is etched, using a resist layer 110 covering the peripheral circuit section P as a mask. Since the silicon oxide film 106, silicon nitride film 107 and the silicon oxide film 108 are etched by this etching by RIE, a sidewall 111 having an increased film thickness dm is formed on the lateral sides of the gate electrode 102 and the interlayer insulating film 104.

After the sidewalls 109, 111 having different film thicknesses for the peripheral circuit section P and the memory cell section M are formed in this manner, a high concentration impurity region 112 is deposited by ion implantation, using the sidewalls 109, 111, gate electrodes 102, 103 and a field oxide film, not shown, as a mask. Since the sidewalls 109, 111 have different film thicknesses, the high concentration impurity region 112 is different in size at a side adjacent to the sidewall 109 and at a side adjacent to the sidewall 111, such that the size of the low concentration impurity region 105 at the bottom of the sidewall becomes shorter at the side of the peripheral circuit section P.

However, if the semiconductor memory device is to be produced by the above-described method, the peripheral circuit section P and the memory cell section M are alternately covered with the resist layers 110, 113. Since a margin is set in the resist layers 110, 113 to take account of masking errors, the resist layers 110, 113 are overlapped with each other at a boundary between the peripheral circuit section P and the memory cell section M, as a result of which the silicon oxide films 106, 108 and the silicon nitride film 107 are left in the form of a pattern.

In addition, the lithographic process needs to be carried out twice with the above method for sidewall formation, while the peripheral circuit section P needs to be etched by wet etching, thus complicating the production process.

OBJECTS AND SUMMARY OF THE INVENTION

It is an object of the present invention to provide a semiconductor memory device of a structure in which the production process is simplified and in which part of the insulating film is not left between the peripheral circuit section and the memory cell section.

In accordance with the present invention, there is provided a semiconductor memory device in which a memory cell section and a peripheral circuit section are formed on one and the same substrate and in which the source regions and the drain regions of MOS transistors of said memory cell section and the peripheral circuit section consist in high concentration impurity regions and low concentration impurity regions, wherein each of said MOS transistors has a first sidewall formed on a lateral side of a gate electrode formed on the substrate via a gate insulating film, and a second sidewall formed on an outer side of said first sidewall, the low concentrations impurity regions of the source regions and the drain regions of the MOS transistors are formed by being delimited by the ends of the gate electrodes, the high concentration impurity regions of the source region and the drain region of the MOS transistor of said peripheral circuit section are formed by being delimited by said first sidewall, and wherein the high concentration impurity regions of the source region and the drain region of the MOS transistor of said memory cell section are formed by being delimited by said second sidewall.

In accordance with the present invention, there is also provided a method for producing a semiconductor memory device in which a memory cell section and a peripheral circuit section are formed on one and the same substrate and in which the source regions and the drain regions of MOS transistors of said memory cell section and the peripheral circuit section consist in high concentration impurity regions and low concentration impurity regions, comprising the steps of forming a gate electrode on the substrate via a gate insulating film, forming a low concentration impurity region in self-alignment with said gate electrode, forming a first sidewall on a lateral side of said gate electrode, forming a high concentration impurity region by ion implantation only on the side of said peripheral circuit section, using said first sidewall as part of a mask, forming a second sidewall on an outer side of said first sidewall, and forming another high concentration impurity region by ion implantation only on the side of said memory cell section, using said second sidewall as part of a mask.

With the semiconductor memory device according to the present invention, the MOS transistors formed on the same substrate for forming the memory cell section and the peripheral circuit section are of a dual sidewall structure comprised of a first sidewall formed on lateral sides of the gate electrodes and a second sidewall formed on an outer side of the first sidewall, so that the lithographic process for separately depositing the sidewalls may be eliminated to simplify the production process.

Besides, with the present semiconductor memory device, the MOS transistor of the memory cell section and the MOS transistor of the peripheral circuit section are formed on one and the same semiconductor substrate. The low concentration impurity regions of the source regions and the drain regions of the MOS transistors are formed by being delimited by the ends of the gate electrodes, the high concentration impurity regions of the source region and the drain region of the MOS transistor of said peripheral circuit section are formed by being delimited by said first sidewall, and the high concentration impurity regions of the source region and the drain region of the MOS transistor of said memory cell section are formed by being delimited by said second sidewall. In this manner, the sidewall of the memory cell section is thicker in film thickness than the sidewall of the peripheral circuit section. Consequently, voltage withstand properties may be achieved between the gate electrodes and other electrodes of the memory cell section in which the layers are formed at extremely small intervals from one another. On the other hand, the sidewall of the peripheral circuit section is reduced in thickness as compared to the sidewall of the memory cell section to prevent the current driving capabilities of the MOS transistor of the peripheral circuit section from being lowered.

With the method for producing the semiconductor memory device according to the present invention, the high impurity concentration region is formed only in the peripheral circuit section by ion implantation at a time point when the first sidewall is formed. After the second sidewall is formed on the entire surface, the high impurity concentration region is formed by ion implantation only in the memory cell section. Consequently, the first and the second sidewalls are formed on the entire substrate surface, that is, the sidewalls are not separately formed, as a result of which the insulating film may be prevented from being partially left at a boundary between the peripheral circuit section and the memory cell section.

DESCRIPTION OF THE PREFERRED EMBODIMENT

Figure 1:
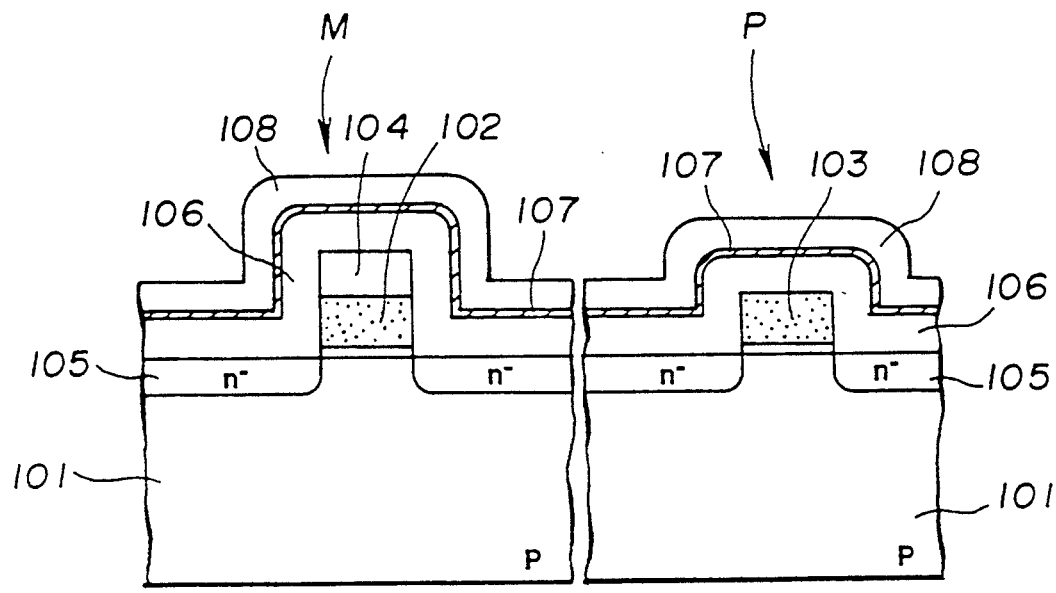
FIG. 1 is a cross-sectional view showing a conventional process for producing a semiconductor memory device, up to a step of forming a silicon oxide film and a silicon nitride film.
Figure 2:
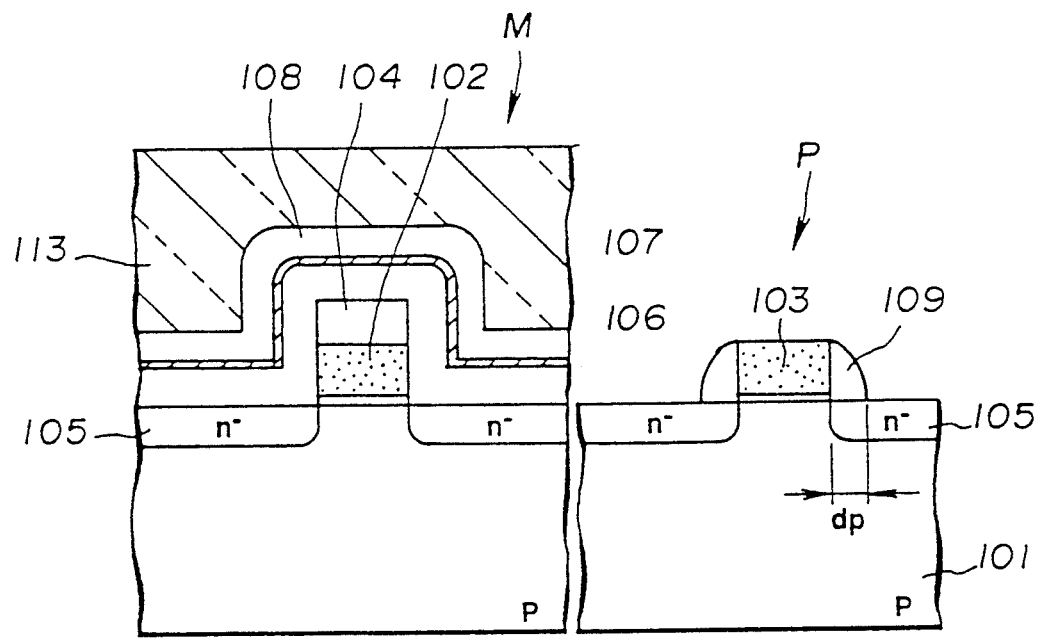
FIG. 2 is a cross-sectional view showing the conventional process of FIG. 1 for producing a semiconductor memory device, up to a step of forming a sidewall of the peripheral circuit section.
Figure 3:
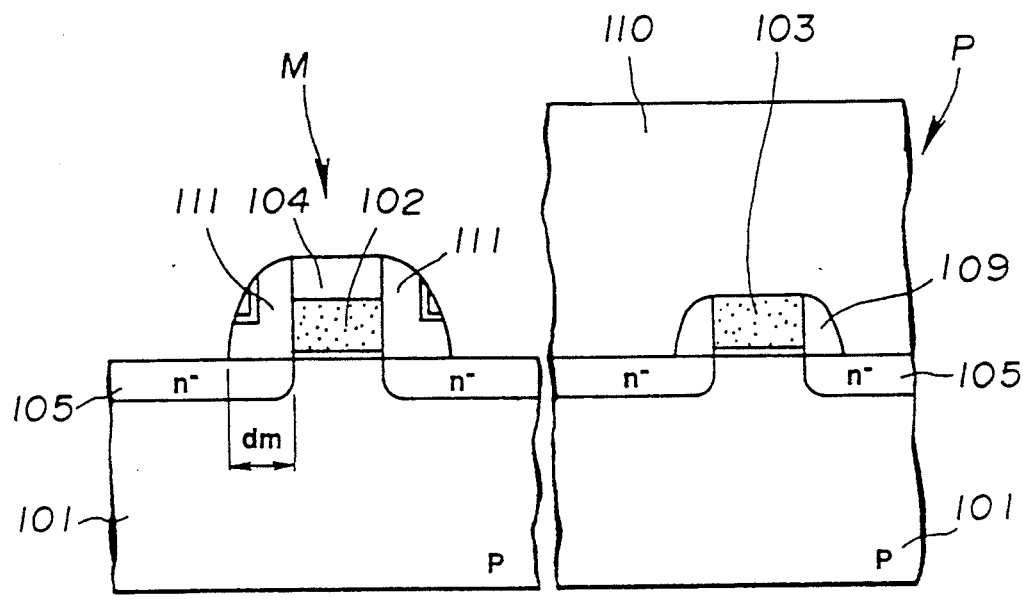
FIG. 3 is a cross-sectional view showing the conventional process of FIG. 1 for producing a semiconductor memory device, up to a step of forming a sidewall of the memory cell section.
Figure 4:
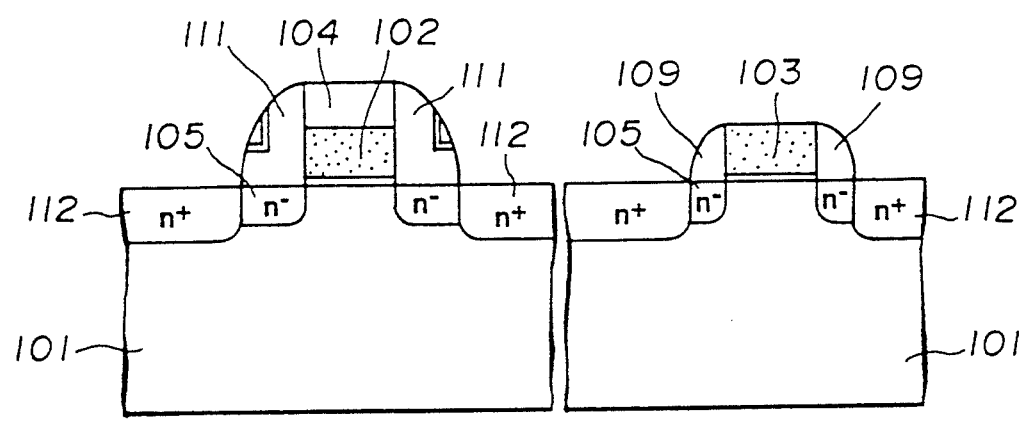
FIG. 4 is a cross-sectional view showing the conventional process of FIG. 1 for producing a semiconductor memory device, up to a step of forming high impurity concentration regions of the sources and drains of the MOS transistors.

Referring to the drawings, the semiconductor memory device according to the present invention and the method for producing the device will be explained in detail.

Figure 5:
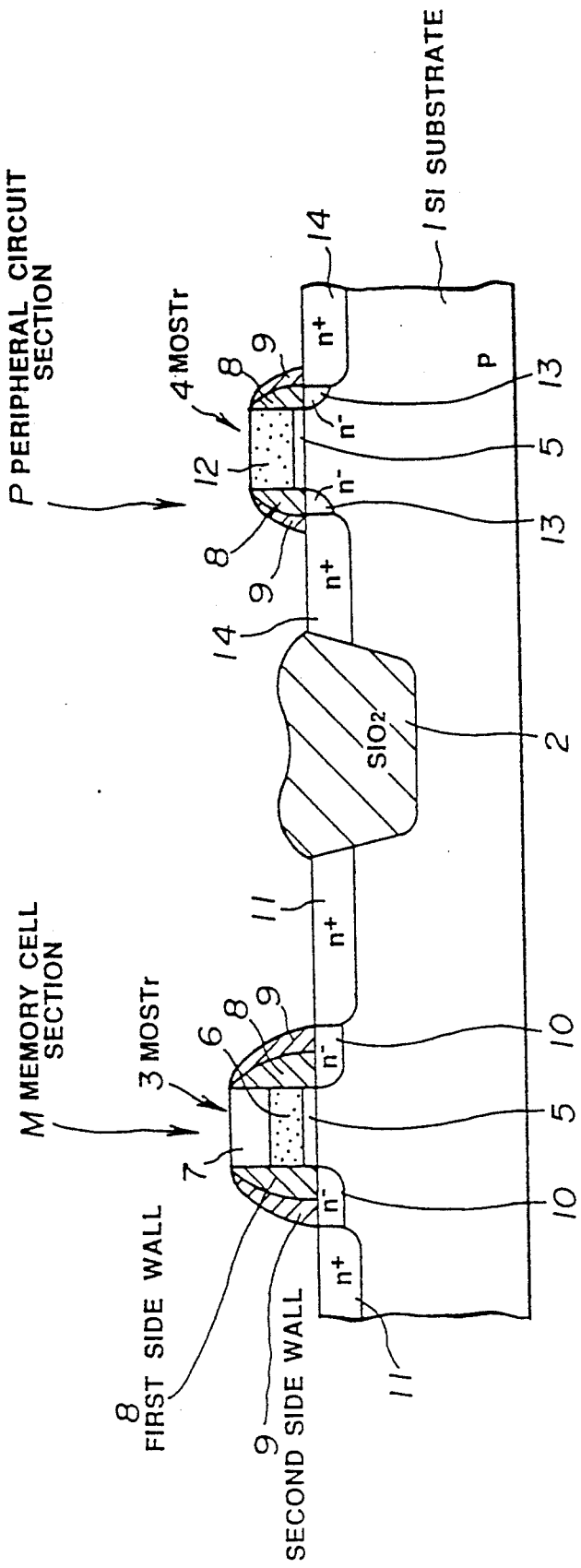
FIG. 5 is a cross-sectional view showing main parts of an embodiment of a semiconductor memory device according to the present invention.

The semiconductor memory device according to the present invention has a construction as shown in FIG. 5 in which a thick field oxide film (LOCOS film) 2 is previously formed on the major surface of a p-type silicon substrate 1 as an isolation region by a selective oxidation method. A region towards the memory cell section M is delimited from a region towards the peripheral circuit section P by the field oxide film 2.

As for the structure of a MOS transistor 3 of the memory cell section M, a gate electrode 6 is formed on the substrate via a gate oxide film 5. The gate electrode 6 is of a polycide structure in which a tungsten silicide film is deposited on a polysilicon film. An insulating film 7 for offsetting, contributing to increased voltage withstand properties, is formed by the same pattern on the gate electrode 6. A first sidewall 8 and a second sidewall 9, each being formed of an insulating film, such as a silicon oxide film, are formed with an upward taper on the lateral sides of the insulating film 7 and the gate electrode 6. The first sidewall 8 is formed adjacent to both lateral sides of the gate electrode 6, while the second sidewall 9 s formed adjacent to both lateral sides of the gate electrode 6 on the outer side of the first side wall 8.

The source region and the drain region of the MOS transistor 3 are an n⁻ type low concentration impurity region 10 and an n⁺ type high concentration impurity region 11. Since the n⁻ type low concentration impurity region 10 is formed by ion implantation in self-alignment with the gate electrode 6 and the insulating film 7, the region 10 is present at a position prescribed by the end part of the gate electrode 6. That is, the end part of the n⁻ type low concentration impurity region 10 has a position in plan which is substantially coincident with the end part of the gate electrode 6 except an diffused area caused by annealing.

On the other hand, since the n⁺ type high concentration impurity region 11 is formed by impurities introduced in self-alignment with the second sidewall 9, the region 11 is present at a position prescribed by the second sidewall 9. That is, except a diffusion area, the end part of the high concentration impurity region 11 has a position substantially coincident in plan with an outer end of the second sidewall 9. Although the n⁻ type low concentration impurity region 10 is present on the substrate surface below the first and second sidewalls 8 and 9, a sufficient inter-layer voltage withstand properties may be maintained by the two sidewalls 8, 9.

As for the construction of a MOS transistor 4 of the peripheral circuit section P, a gate electrode 12 is formed on the substrate via a gate oxide film 5. The gate electrode 12 is of a polycide structure in which a tungsten silicide film is deposited on a polysilicon film. On the lateral side of the gate electrode 12, a sidewall 8 and a sidewall 9, both of which are tapered upward, are formed as in the case of the memory cell section M. However, the sidewalls 8, 9 of the peripheral circuit section P are of reduced height because of the absence of the offsetting insulating film 7. The first and second sidewalls 8, 9 are formed by insulating films, such as silicon oxide films. The first sidewall 8 is formed adjacent to both lateral sides of the gate electrode 12, while the second sidewall 9 is formed on the outer side of the first side wall 8.

The source region and the drain region of the MOS transistor 4 are an n⁻ type low concentration impurity region 13 and an n⁺ type low concentration impurity region 14. Since the n⁻ type low concentration impurity region 13 is formed by ion implantation in self-alignment with the gate electrode 12, the region 10 is present at a position prescribed by the end part of the gate electrode 12. That is, except an diffused area caused by annealing, the n⁻ type low concentration impurity region 13 has a position in plan which is substantially coincident with the end part of the gate electrode 12.

However, in distinction from a corresponding structure of the memory cell section M, the n⁺ type high concentration impurity region 14 is formed by impurities introduced in self-aligned manner with the first sidewall, the region 14 is present at a position prescribed by the first sidewall 8. That is, the end of the high concentration impurity region 14 is present at a position substantially coincident in plan with the end of the first sidewall 8, so that the n⁻ type low concentration impurity region of the MOS transistor 4 is smaller in size than that of the MOS transistor 3 by an amount corresponding to the thickness of the second sidewall 9.

With the semiconductor memory device of the embodiment illustrated, a sufficiently high interlayer voltage withstand properties may be maintained in the MOS transistor 3 of the memory cell section M, so that, when a memory node side electrode is formed on an outer side of the second sidewall 9, the transistor 3 may be positively operated as a DRAM access transistor. On the other hand, the n⁻ type low concentration impurity region 13 of the MOS transistor 4 of the peripheral circuit section P is reduced in size to decrease resistance components to increase the current driving capabilities.

The above-described semiconductor memory device is produced by the process shown in FIGS. 6 to 13.

Figure 6:
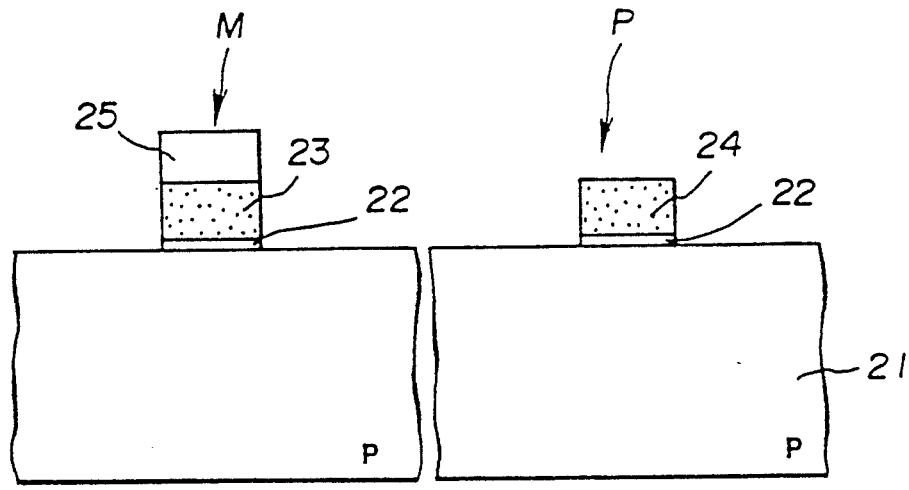
FIG. 6 is a cross-sectional view showing a process for producing a semiconductor memory device according to the present invention, up to the step of patterning a gate electrode.

A gate oxide film 22 is first formed on a p-type silicon substrate 21, as shown in FIG. 6. Meanwhile, a well region, a field oxide film, a channel stop region etc. are assumed to have been previously formed as in the customary memory production process, in a manner not shown.

Gate electrodes 23, 24 are formed on the gate oxide film 22. The gate electrode 23 is a gate electrode formed on the side of the memory cell section M and having an interlayer insulating film for offsetting 25 formed on its upper portion. The gate electrode 24 is a gate electrode formed on the side of the peripheral circuit section P. These gate electrodes 23, 24 are of a polycide structure in which a tungsten silicide film is formed on a polysilicon layer, and are formed by patterning the film formed on the entire surface by a lithographic method. An insulating film for offsetting 25 has the same pattern as that of the gate electrode 23 and is patterned simultaneously with the gate electrode 23. By this patterning, lateral sides perpendicular to the major surface of the substrate are formed on the gate electrodes 23, 24 and the insulating film 25.

Then, using the gate electrodes 23, 24 and the insulating film 25, as part of the mask, impurities for forming a low concentrating impurity region in a self-aligned manner are introduced into the substrate surface by ion implantation. The impurities may, for example, be phosphorus (P). By this impurity implantation, an n⁻low concentration impurity region 27, delimited by the ends of the gate electrodes 23, 24, is formed for both the memory cell section M and the peripheral circuit section P.

Figure 7:
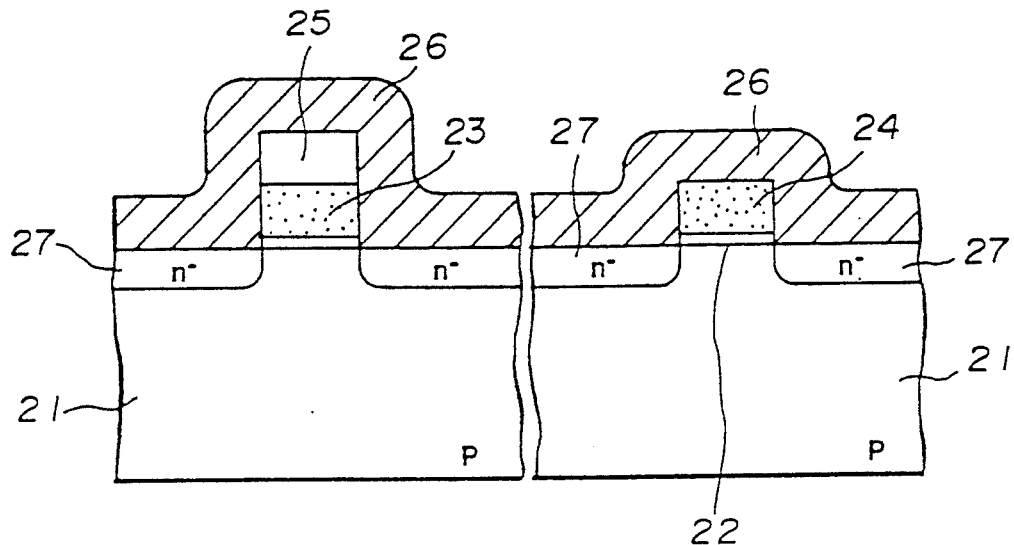
FIG. 7 is a cross-sectional view showing a process for producing a semiconductor memory device according to the present invention, up to the step of depositing a silicon oxide film by CVD.

After the ion implantation, for the deposition of the low concentration impurity region 27, a silicon oxide film 26 is formed on the entire surface, such as by a CVD method, as shown in FIG. 7. This silicon oxide film 26 is a film for forming a first sidewall and is deposited on the sidewalls of the gate electrodes 23, 24 and the insulating film 25 and on the top sides of the insulating film 25 and the gate electrode 24.

Figure 8:
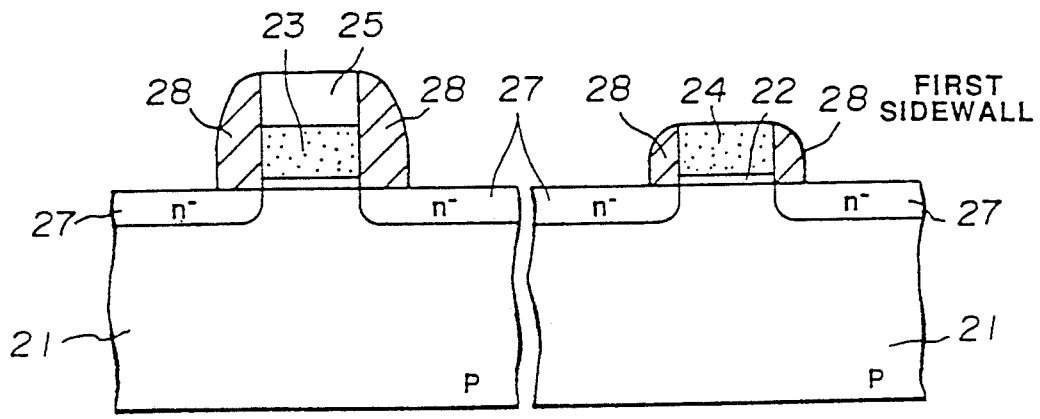
FIG. 8 is a cross-sectional view showing a process for producing a semiconductor memory device according to the present invention, up to the step of forming the first sidewall.

Then, as shown in FIG. 8, the entire surface is etched back by RIE of selectively etching the silicon oxide film 26. By this etchback operation, the silicon oxide film 26 is reduced in its film thickness to produce the first sidewall 28 by a part of the silicon oxide film 26 being left on the sidewalls of the gate electrodes 23, 24.

Figure 9:
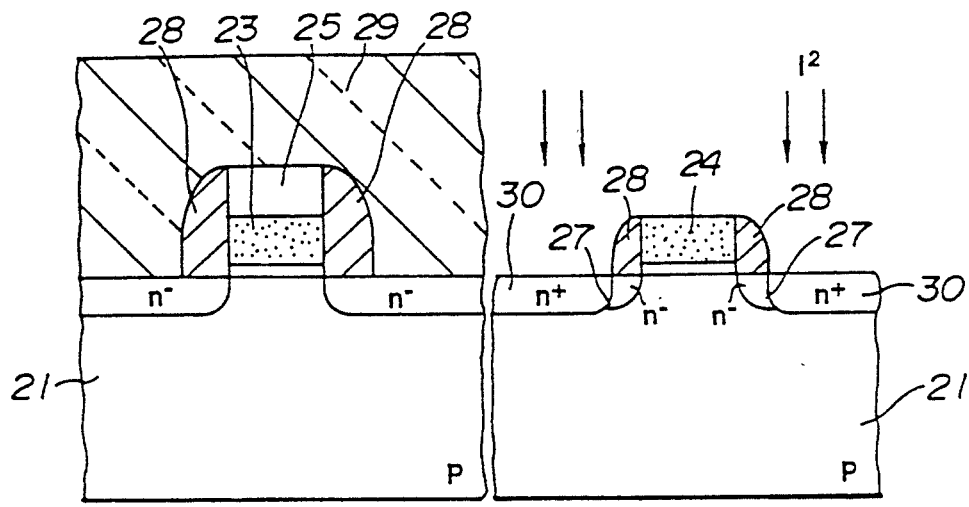
FIG. 9 is a cross-sectional view showing a process for producing a semiconductor memory device according to the present invention, up to the step of ion implantation into the peripheral circuit section.

After forming the first sidewall 28 in this manner, a resist layer 29 is applied on the entire surface. The resist layer 29 is selectively exposed to light and developed to form a resist mask which is opened only at the peripheral circuit section P as shown in FIG. 9.

After forming the resist mask in this manner, impurities are implanted only at the opened side of the resist layer 29, that is only on the side of the peripheral circuit section P, by ion implantation. The impurities may, for example, be arsenic (As). On the side of the peripheral circuit section P, impurities are implanted at a higher concentration in self-alignment with the sidewall 28 and the gate electrode 24 to form a high concentration impurity region 30 after the activation process by annealing following the subsequent formation of a silicon oxide film 31. Since the first sidewall 28 is used as a mask, the high concentration impurity region 30 is delimited by the first sidewall 28, so that an offset of the impurity region 30 from the end of the first sidewall 28 is substantially equal to the film thickness of the first sidewall 28. Consequently, the size of the low concentration impurity region 27 of the peripheral circuit section P is limited substantially to the thickness of the first sidewall 28, except the diffused area brought about by annealing. Although the resist layer 29 is used for the ion implantation step, the resist layer is not used as a mask for anisotropic etching, so that there is no risk of the insulation layer being left due to resist layer overlap at a boundary between the memory cell section M and the peripheral circuit section P.

Figure 10:
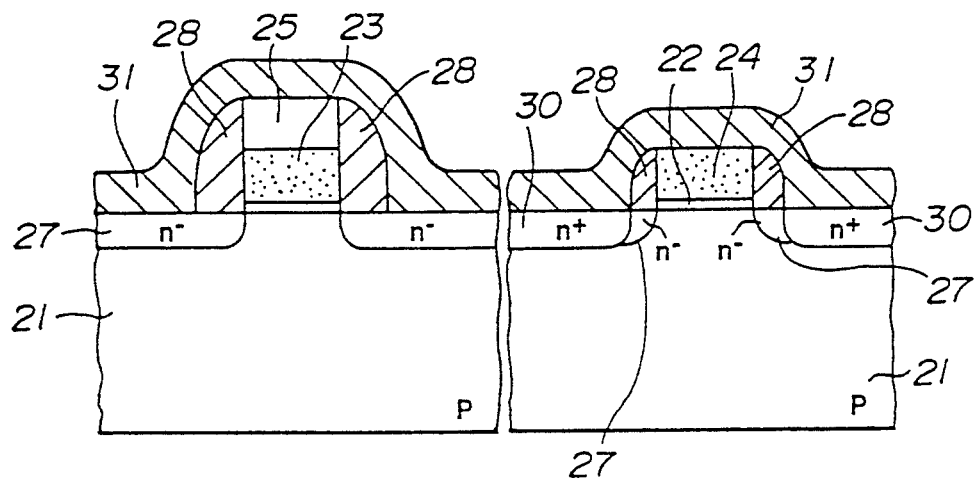
FIG. 10 is a cross-sectional view showing a process for producing a semiconductor memory device according to the present invention, up to the step of depositing a silicon oxide film by CVD.

The resist layer 29 is then removed and a silicon oxide film 31 for forming a second sidewall is formed on the entire surface by the CVD method as shown in FIG. 10.

Figure 11:
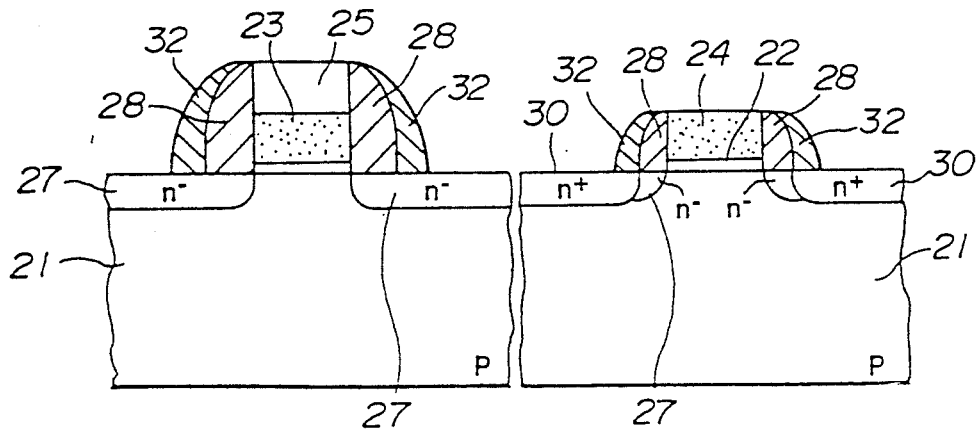
FIG. 11 is a cross-sectional view showing a process for producing a semiconductor memory device according to the present invention, up to the step of forming a second sidewall.

The second sidewall 32 is then formed on an outer side of the first sidewall 28 by an etchback process similar to that used for forming the first sidewall 28, as shown in FIG. 11. The second sidewall 32 is formed simultaneously for each of the peripheral circuit section P and the memory cell section M.

Figure 12:
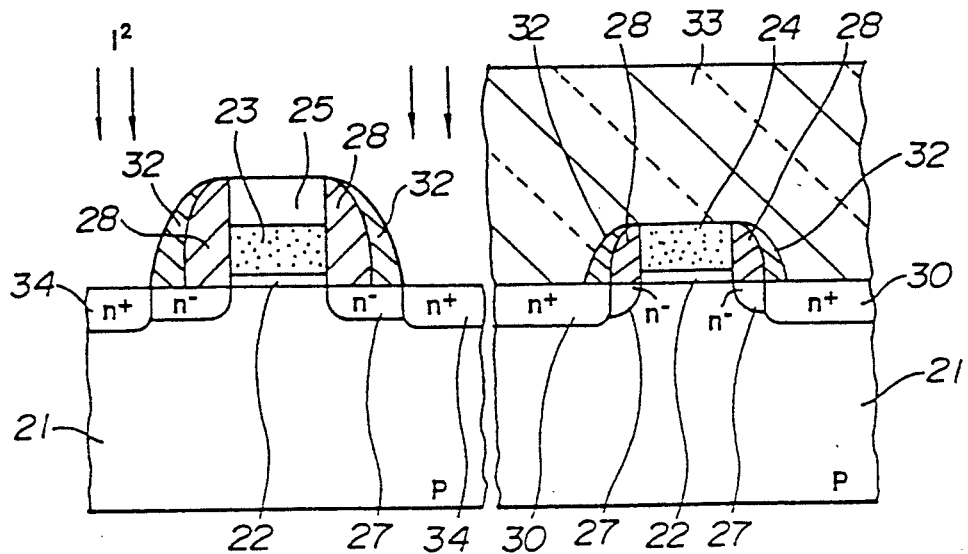
FIG. 12 is a cross-sectional view showing a process for producing a semiconductor memory device according to the present invention, up to the step of ion implantation into the memory cell section.

After forming the second sidewalls 32 in this manner, a resist layer 33 is applied on the entire surface and processed by selective light exposure and development to produce a mask which is opened at the memory cell section M. An n⁺ type high concentration impurity region 34 is then formed by ion implantation on the substrate surface of the memory cell section M, as shown in FIG. 12. The n⁺ high concentration impurity region 34 is formed in self-alignment with the second sidewall 32, so that it is delimited by the end of the second sidewall 32. On the other hand, the resist layer 33 is formed for ion implantation and is not used as a mask for RIE, so that there is no risk of the insulating layer being left due to resist layer overlapping at a boundary between the memory cell section M and the peripheral circuit section P.

Figure 13:
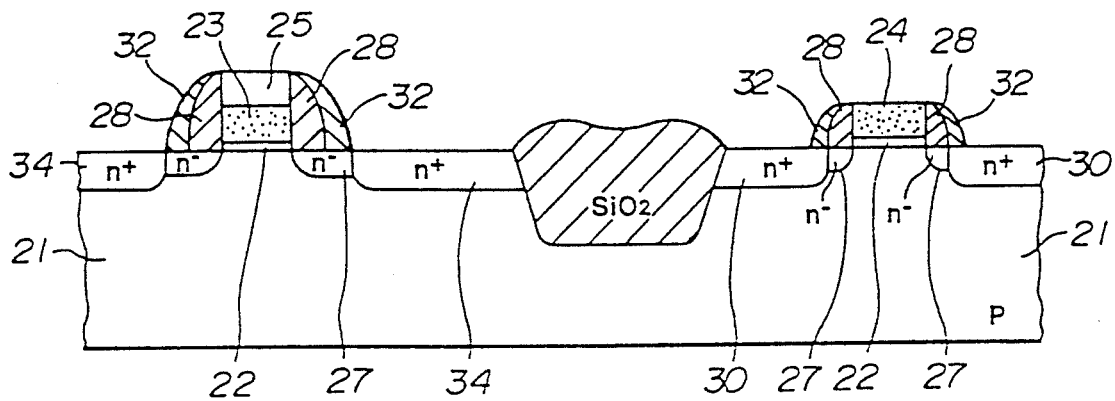
FIG. 13 is a cross-sectional view showing the process for producing the semiconductor memory device according to the present invention, subsequent to the step of removing the resist layer.

The resist layer 33, used as the mask, is then removed from the substrate, as shown in FIG. 13. The device is completed after subsequent formation of the interlayer insulating film, a metallization layer, such as word and bit lines, capacitors and resistors.

With the above-described production process according to the present invention, the first and second sidewalls 28, 32 are formed simultaneously at the sides of the peripheral circuit section P and the memory cell section M, so that there is no risk of the insulating film being left due to resist layer overlapping at the boundary between the memory cell section M and the peripheral circuit section P. Besides, the photolithographic process is not required for the deposition of the sidewall itself to simplify the process outstandingly.

What is claimed is:

1. A semiconductor memory device in which a memory cell section and a peripheral circuit section are formed on one and the same substrate and in which the source regions and the drain regions of MOS transistors of said memory cell section and the peripheral circuit section consist in high concentration impurity regions and low concentration impurity regions, characterized in that
each of said MOS transistors has a first sidewall formed on a lateral side of a gate electrode formed on the substrate via a gate insulating film, and a second sidewall formed on an outer side of said first sidewall,
the low concentration impurity regions of the source regions and the drain regions of the MOS transistors are formed by being delimited by the ends of the gate electrodes and by the periphery of said high concentration impurity regions,
the high concentration impurity regions of the source region and the drain region of the MOS transistor of said peripheral circuit section are formed by being delimited by said first sidewall, and in that
the high concentration impurity regions of the source region and the drain region of the MOS transistor of said memory cell section are formed by being delimited by said second sidewall.

2. The semiconductor memory device as defined in claim 1 wherein the height of said first sidewall and said second sidewall is defined by the sum of the thicknesses of said gate insulating film, said gate electrode and the offsetting insulating film formed on said gate electrode in said memory cell section and by the sum of the thicknesses of said gate insulating film and said gate electrode in said peripheral circuit section.

3. The semiconductor memory device as defined in claim 1 wherein said gate electrode is of a polycide structure including a silicide layer formed on a polysilicon layer.

4. The semiconductor memory device as defined in claim 1 wherein said low concentration impurity region is formed of phosphorus and wherein said high concentration impurity region is formed of phosphorus and arsenic.

5. A method for producing a semiconductor memory device in which a memory cell section and a peripheral circuit section are formed on one and the same substrate and in which the source regions and the drain regions of MOS transistors of said memory cell section and the peripheral circuit section consist of high concentration impurity regions and low concentration impurity regions, comprising the steps of forming a gate electrode on the substrate via a gate insulating film, forming a low concentration impurity region in self-alignment with said gate electrode, forming a first sidewall on a lateral side of said gate electrode, forming a high concentration impurity region by ion implantation only on the side of said peripheral circuit section, using said first sidewall as part of a mask, forming a second sidewall on an outer side of said first sidewall, and forming another high concentration impurity region by ion implantation only on the side of said memory cell section, using said second sidewall as part of a mask.

6. The method as defined in claim 5 wherein ion implantation for forming said low concentration impurity region is made using phosphorus as a dopant and wherein ion implantation in which said first sidewall or said second sidewall is used as part of the mask is made using arsenic as a dopant.

* * * * *